(12) United States Patent
Hemmert et al.

(10) Patent No.: US 8,359,428 B1
(45) Date of Patent: Jan. 22, 2013

(54) ASSOCIATIVE LIST PROCESSING UNIT

(75) Inventors: Karl Scott Hemmert, Albuquerque, NM (US); Keith D. Underwood, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 1103 days.

(21) Appl. No.: 12/243,772

(22) Filed: Oct. 1, 2008

Related U.S. Application Data

(60) Provisional application No. 60/976,978, filed on Oct. 2, 2007.

(51) Int. Cl.
*G06F 12/00* (2006.01)
(52) U.S. Cl. .................................................. 711/108
(58) Field of Classification Search ..................... None
See application file for complete search history.

(56) References Cited

U.S. PATENT DOCUMENTS

| | | | | |
|---|---|---|---|---|
| 7,289,442 | B1 * | 10/2007 | Srinivasan et al. | 370/230 |
| 7,822,918 | B2 * | 10/2010 | Karstens | 711/112 |
| 2002/0161969 | A1 * | 10/2002 | Nataraj et al. | 711/108 |
| 2004/0260867 | A1 * | 12/2004 | Feldmeier | 711/108 |
| 2007/0136514 | A1 * | 6/2007 | Roth et al. | 711/108 |
| 2007/0217244 | A1 * | 9/2007 | Narayanaswamy et al. | 365/49 |

OTHER PUBLICATIONS

Underwood, Keith D., et al., "A Hardware Acceleration Unit for MPI Queue Processing", Parallel and Distributed Processing Symposium 2005; Proceedings 19th IEEE International, Apr. 4, 2005, pp. 96b.

\* cited by examiner

*Primary Examiner* — Jared Rutz
*Assistant Examiner* — Daniel Tsui
(74) *Attorney, Agent, or Firm* — Jeffrey D. Myers

(57) ABSTRACT

An associative list processing unit and method comprising employing a plurality of prioritized cell blocks and permitting inserts to occur in a single clock cycle if all of the cell blocks are not full. Also, an associative list processing unit and method comprising employing a plurality of prioritized cell blocks and using a tree of prioritized multiplexers descending from the plurality of cell blocks.

10 Claims, 3 Drawing Sheets

ASSOCIATIVE LIST PROCESSING UNIT

CROSS-REFERENCE TO RELATED APPLICATIONS

This application claims priority to and the benefit of the filing of U.S. Provisional Patent Application Ser. No. 60/976,978, entitled "An ALPU with Reduced Internal Data Movement and Multiple Match Support", filed on Oct. 2, 2007, and the specification and claims thereof are incorporated herein by reference.

STATEMENT REGARDING FEDERALLY SPONSORED RESEARCH OR DEVELOPMENT

The Government has rights to this invention pursuant to Contract No. DE-AC04-94AL85000 awarded by the U.S. Department of Energy.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to associative list processing units (ALPUs), particularly those used in handling Message Passing Interface (MPI) data packets.

2. Description of Related Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

The present invention provides improvements to the associative list processing unit (ALPU) described in K. D. Underwood, et al., "A hardware acceleration unit for MPI queue processing", 19th International Parallel and Distributed Processing Symposium (April 2005), which is incorporated herein by reference. One improvement optimizes the entry management scheme to minimize internal data movement. The second allows the unit to report all matches from a request in priority order, instead of providing only the highest priority match.

BRIEF SUMMARY OF THE INVENTION

The present invention is of an associative list processing unit and method comprising employing a plurality of prioritized cell blocks and permitting inserts to occur in a single clock cycle if all of the cell blocks are not full. In the preferred embodiment, each cell block employs a counter indicating the number of free lower priority cells. Each counter is initialized to the total number of cells with lower priority. The invention further comprises decrementing each counter for each insert to a lower priority cell block and incrementing each counter for each delete from a lower priority cell block.

The present invention is further of an associative list processing unit and method comprising employing a plurality of prioritized cell blocks and using a tree of prioritized multiplexers descending from the plurality of cell blocks. In the preferred embodiment, first-in first-out queues follow each multiplexer. Each multiplexer is an asynchronous, stateless circuit passing through the highest priority valid input. The invention can operate either in single-match mode or in multiple-match mode.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The present invention is of an apparatus and method providing improvements to APLUs, particularly those used with MPI. A first improvement provides greatly improved entry management, while the second reports all matches in priority order.

The goals of the entry management improvement are minimizing the number of entry moves and maximizing the availability for new entry insertion. Another important aspect of the preferred implementation is the need to localize control in order to keep operating frequency high. In the original implementation described in the references cited above, control was localized by allowing each cell block to have information about only the lowest priority cell in the next higher priority cell block. The consequence of this was that an insert may have to stall while the entries are moved in order to make room in the lowest priority cell. In order to improve insert availability, the ALPU would compact (move entries to higher priority cells) when the unit was in insert mode and no matching or inserts were currently taking place. In addition, a delete would cause all cells lower than the deleted cell to move one entry up, leaving the lowest priority cell free. The result of this scheme was that inserts were only guaranteed to be able to complete every other clock cycle, although, under certain circumstances, inserts could complete every clock cycle. More importantly, the unit could potentially move much more data than was necessary.

Figure 3:
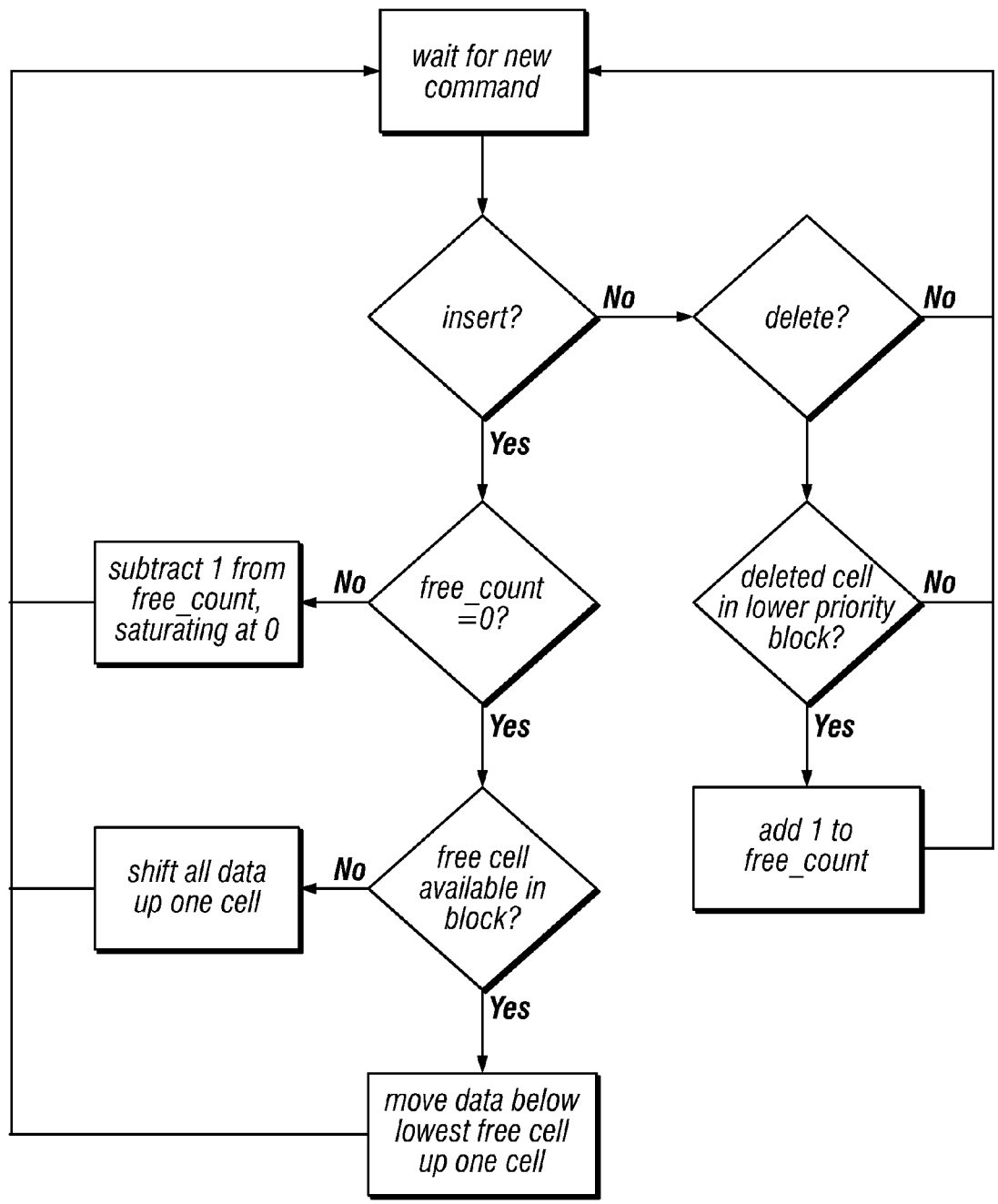
FIG. 3 is a flow diagram of the entry management improvement of the invention.

The preferred management scheme of the invention provides the minimum number of moves for all combinations of inserts and deletes, and allows inserts to always happen without delay (as long as the unit is not full), while still maintaining locality in the control logic. Because the improved scheme uses the minimum number of moves, it will use the lowest possible power for managing the list entries. This is done by having each block maintain more information about the global state of the unit. In particular, each cell block maintains a counter (referred to hereafter as the free counter) which tracks the number of entries which are free in lower priority blocks (items enter the unit at the lowest priority block and proceed to higher priority blocks as more items are inserted). A flow diagram of the preferred apparatus and method of the invention is given in FIG. 3.

The free counter is maintained using only the global insert and delete signals (which are registered as they are fanned out as described in the references above). On power-up or reset, the free counter in each block is initialized to the total number of cells in blocks with lower priority (e.g., if the block size is 8, then the free counter in block 0 is set to zero, block 1 to 8, block 2 to 16, etc.). Thereafter, the counter is decremented for each insert and incremented for each delete which occurs in a lower priority block. The counter "saturates" at zero so that it will never go negative, as one cannot have a negative amount of free space.

The entry management control is localized to the cell block and uses the block's free counter as well as the valid signals from all cells in the block. On a delete, the valid bit for the deleted entry is set to zero and the free counter is modified as explained above; thus, there is no longer any data movement on a delete. On an insert, all entries below the lowest priority free cell are moved up one entry to make room for the insert. The blocks handle this by dealing with three cases:

Case 1: When the free counter is greater than 0, there is room in lower priority block to "absorb" the insert, therefore the current block does nothing.

Case 2: When the free counter is equal to 0 and at least one of the cells in the block is empty, the block "absorbs" the insert by moving up all entries below the empty cell (including accepting the highest priority entry from the previous block to the lowest priority cell in the current block). Entries above the first empty cell in the block are not affected.

Case 3: When the free counter is equal to 0 and no cell in the block is empty, the insert must be "absorbed" in a higher priority cell. The current block simply moves all entries up one cell. This includes moving the top entry to the next higher block and accepting the top entry from the previous block into the lowest cell in the current block. There is guaranteed space in a higher priority cell because the ALPU maintains a count of the total number of entries in the unit and disallows inserts when the unit is full.

The preferred multiple match mode of the invention is important for providing flexibility. This mode can allow the ALPU to act as a filter to narrow potential matches when all the matching information cannot be stored in the ALPU. This case can arise for three main reasons: first, not all match information can be formulated as a ternary match; second, including all the necessary match bits would require too much area; and third, protocol changes after the hardware is produced create either of the first two cases.

In multiple match mode, auto-delete is turned off; the actual process of deletion remains the same (the cell to be deleted is specified by its cell address), but is initiated by an external source. This change requires a change only at the highest level control state machine. However, actually reporting all the matches requires two other changes to the original structure. In the original implementation, simple muxes (multiplexers) were used to select the input with the highest priority at each level. The result was a single output which was the highest priority match. In the inventive mode, all valid matches must be reported in order from highest priority to lowest. This is accomplished by replacing the simple muxes and registers of the prioritization tree with priority muxes and fifos (first-in first-out queues). The second preferred change is a modification to the ternary cell valid bit. Since the priority mux requires the inputs to be stateful (the priority mux must be able to "read" from an input), the match bit logic in the ternary cell must be modified to allow a read (which causes the match bit to deassert). This allows the priority mux to pass each match once (and only once) in priority order.

Figure 1:
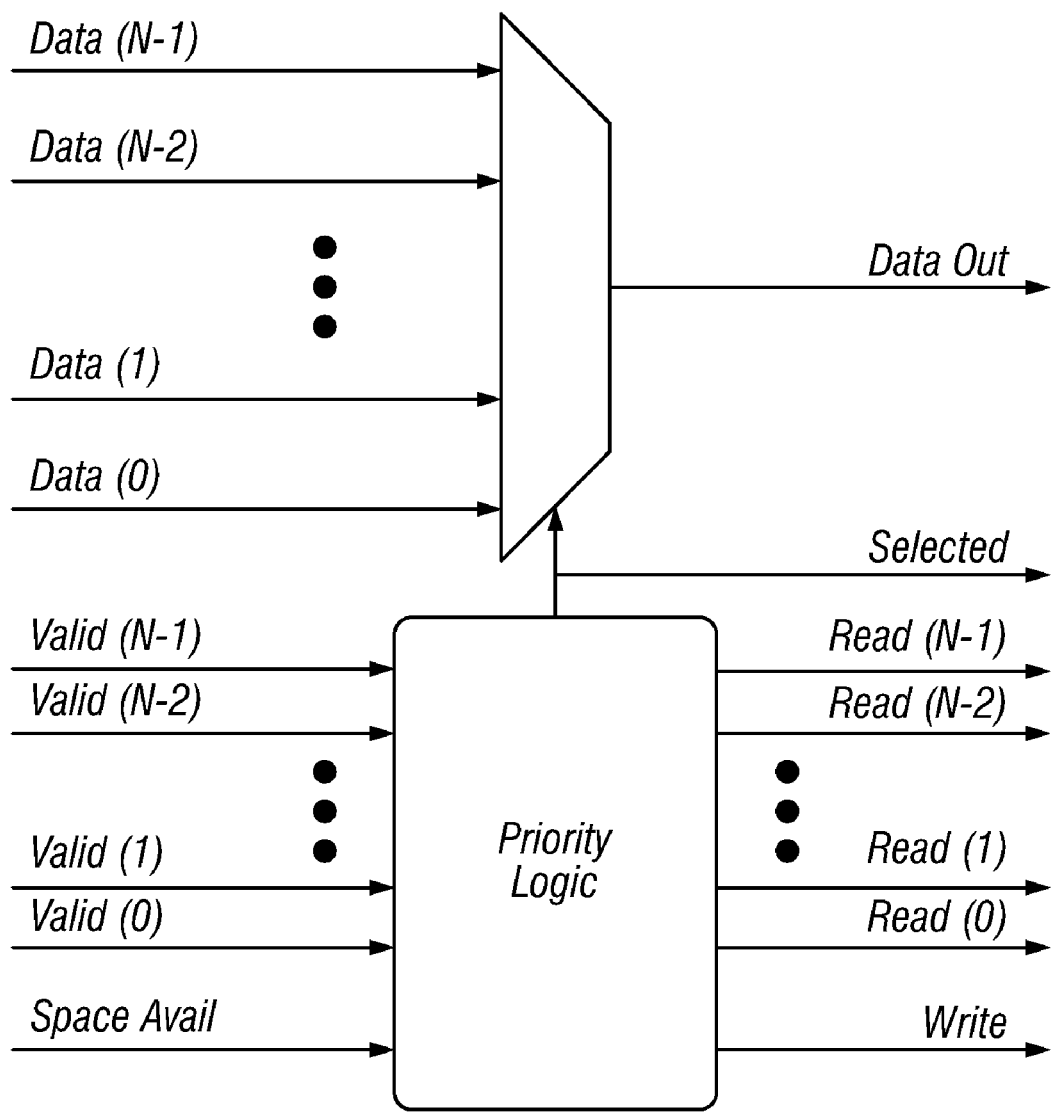
FIG. 1 is a block diagram of the priority multiplexer of the invention.

The priority mux is an asynchronous, stateless circuit which passes through the highest priority valid input. A block diagram of the priority mux is shown in FIG. 1. The priority mux can have any number of input ports (though in the ALPU, it is best to have a power of two in order to easily compute the address of each match). Each input port comprises three signals: data, valid and read. The valid signal is asserted by the input when valid data is available and the read signal is asserted by the priority mux when the data from that port is passed through to the output and there is space available in the output fifo. The output port also consists of three signals: data out, space available and write. Space available is asserted by the output target when it can accept data and the write signal is asserted when the priority mux writes to the output (this occurs when there is valid data on any of the inputs and there is space available in the output fifo). In addition, the priority mux provides the selected input number as an output to facilitate the generation of the address of each match.

Figure 2:
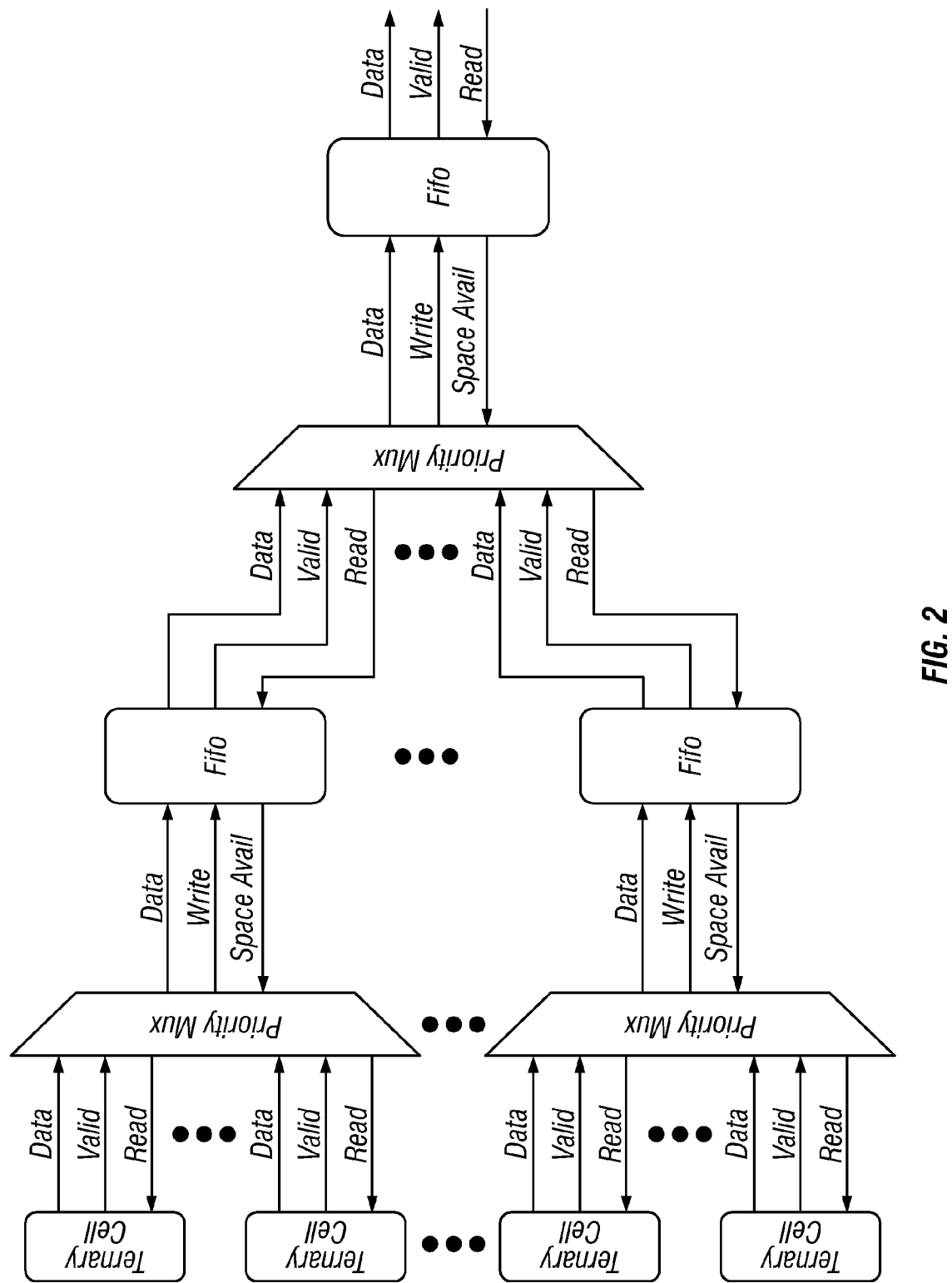
FIG. 2 is a block diagram of the two-level priority multiplexer tree of the invention.

For small ALPUs, a single level of priority muxing may be enough to create the outputs and still maintain the desired operational frequency. For larger sizes which cannot do this, multiple levels of muxing will be necessary to produce the results. In this case, the priority muxes are connected in a tree structure. The first level muxes will select outputs directly from the ternary cells. All succeeding levels will pull their inputs from the previous level of muxes. The output of each level of muxing is fed into a fifo. The fifos allow lower priority paths to block while waiting to be transmitted by the priority mux and needs two entries in order to ensure no "bubbles" in the output of the tree. Because of the fifos used between stages, each stage requires a clock cycle to complete. Thus, the size of the muxes can be adjusted to balance operational frequency and latency (bigger muxes mean lower latency, but also lower operational frequency). A block diagram of a two level priority mux tree is shown in FIG. 2. Note that the tree can be configured with any number of levels, two is shown for simplicity.

The priority mux tree provides all matches in priority order. The first result arrives at the output after a latency in clock cycles equal to the number of levels in the tree. Thereafter, a new result arrives each clock cycle until all results are reported. For convenience, an "end of list" entry is sent after all valid matches (or in the case of no valid matches, it is the only result returned). This value is denoted by adding an extra bit to the data (e.g., tag) width which is set to one for the end of list and to zero otherwise. This result is generated by adding a phantom cell (i.e., there is no corresponding physical cell) which has a logical lower priority than the lowest priority cell. This is done by adding an extra input to the mux which selects from the lowest priority cells in the unit. This new input is considered to be the lowest priority input, but is not considered when generating the address of the matching cell (i.e., the other inputs are still labeled 0 through N). Having the lowest logical priority, this end of list entry will always be the last result passed to the output.

It is desirable to allow the unit to clear current matches without having to flush all the results through the output fifo. This makes it possible to complete a match operation early when an early entry is found to be the desired match. This in turn reduces the time before the next match can be initiated. This can be done by adding a flush signal to the ternary cells and to the fifos in the mux tree. When asserted, the fifos will go back to their empty state and the ternary cells will deassert all their match signals.

A single associative list processing unit can support both the original single match mode and the new multiple match mode; a mode bit is used to determine which mode is active at any given time. Multiple match mode acts as described (in particular, auto-deletion would be turned off). Single match mode returns only the first match and then uses the flush signal to remove all other matches from the mux tree. Single match mode also has the option of initiating an auto-delete on the matched item. The auto-delete behavior could be controlled by a mode bit or could be enabled automatically whenever single match mode was active, depending on the implementation.

Another way to minimize data movement is to relax the requirement that relative position in the ALPU determines priority. This may be done for multiple reasons: first, it may reduce the overall power requirements of the unit (with the caveat that it may increase silicon area). Second, it may be desirable to use existing TCAM (ternary content addressable memory) IP, which would not include the required ordering semantics of the ALPU, as a basis for the design. The main difference with this type of design is that an ALPU entry would be allowed to be inserted at any position in the unit, and would never move from that position. The consequences of this are described below.

In this scenario, the core of the ALPU is a traditional TCAM structure. The match and mask information are stored in the TCAM, and the ternary match operation is computed in the TCAM. The output of the TCAM is a single bit for each entry identifying which entries matched the request. Auxiliary memory elements (likely registers, but possibly SRAMs) would store the other required information: tag, valid and priority. The tag serves the identical purpose as in a traditional ALPU structure. The valid bit is used both during a match and an insert. During a match, the valid bits indicate which cells hold valid data and positive match results on invalid cells are ignored, thus, a cell can be deleted simply be setting the valid bit to invalid (of course, it is also possible to delete the entry out of the TCAM). During an insert, the ALPU uses the valid bit information to determine which address to load the new data into. The priority of each cell is used to determine the highest priority cell in the case of multiple matches in the TCAM. The highest priority match is found by pair wise comparison of the match results (ignoring those results with the valid bit set to invalid). At each stage, the higher priority match is selected and passed through the mux to the next stage. The result of the muxing is a single result which is the highest priority match.

The priority of each cell must be tracked through insertions and deletions. There are two main ways to track priorities. The first is to keep a simple counter to track the priority of inserted elements; inserted elements are assigned the current value of the priority counter, and the counter is incremented in preparation for the next insert. In this case, priority is given to smaller numbers (of course, priority could be given to larger numbers, in which case the priority counter would be decremented with each insert). This would require a priority field that has many more possible values than there are cells in the ALPU. While this method is straightforward, it has two disadvantages. First, the bit-width of the comparisons to determine priority is larger than strictly necessary. Second, at some point, the counter will need to wrap from maximum value back to zero (or zero back to maximum value in the case of larger numbers having priority), at which point the existing priorities would need to be adjusted appropriately. This operation is non-trivial and could consuming a lot of time, so is likely to have performance implications.

The second method is to set each cell's priority at insertion time based on the number of current valid entries in the ALPU. In this case, each cells priority is updated with each delete that takes place. The priority counter in this case would be updated for both inserts and deletes and would only need to have enough bits to represent values up to the number of cells in the ALPU. Individual cells update their priority whenever a cell with higher priority is deleted; this is done by setting its priority to the next highest value. This results in an increment or a decrement depending on whether high or low values have priority; either of these schemes can be used, depending on the physical implementation of the unit. The advantages of this scheme is that the priority field need only have as many possible values as the number of cells in the unit (thus, minimizing bit width) and it avoids the issues of wrap around. The disadvantage is that each cell now requires a comparator to detect when a higher priority cell is deleted, and an incrementor or decrementor to adjust the priority of the cell. This will have impact on the silicon area of the unit. This area increase can be mitigated by having multiple cells share these structures; of course, this will have some impact on the performance of deletes as it will now take multiple cycles in order to adjust the priorities for all the cells (this is probably tolerable as long as only a small number of cells share these structures).

The idea of sharing resources can also be extended to the muxing logic used to find the highest priority. In this instance, the ALPU is broken into blocks, where each block shares the logic for adjusting priorities, as well as for comparing priorities after a match. There are positive and negative aspects to this type of arrangement. On the positive side, this arrangement allows the priorities and tags to be stored in SRAM cells at the block level, instead of registers, as only one value is needed at a time, resulting in dramatic area savings. The negative side, of course, is that it now takes more time to complete a match operation since some of the parallelism has been removed.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An associative list processing unit comprising:
    a plurality of prioritized cell blocks; and
    a tree of prioritized multiplexers descending from said plurality of cell blocks; and
    wherein said tree adds a phantom cell having a logical lower priority than the lowest priority cells.

2. The associative list processing unit of claim 1 additionally comprising first-in first-out queues following each multiplexer.

3. The associative list processing unit of claim 1 wherein each multiplexer is an asynchronous, stateless circuit passing through the highest priority valid input.

4. The associative list processing unit of claim 1 operating in single-match mode.

5. The associative list processing unit of claim 1 operating in multiple-match mode.

6. An associative list processing method comprising the steps of:
   employing a plurality of prioritized cell blocks;
   using a tree of prioritized multiplexers descending from the plurality of cell blocks; and
   adding into the tree a phantom cell having a logical lower priority than the lowest priority cells.

7. The associative list processing method of claim 6 additionally comprising employing first-in first-out queues following each multiplexer.

8. The associative list processing method of claim 6 wherein each multiplexer is an asynchronous, stateless circuit passing through the highest priority valid input.

9. The associative list processing method of claim 6 operating in single-match mode.

10. The associative list processing method of claim 6 operating in multiple-match mode.

* * * * *